United States Patent
Mohindra

[11] Patent Number: 6,148,047
[45] Date of Patent: Nov. 14, 2000

[54] DC OFFSET COMPENSATION FOR ZERO IF QUADRATURE DEMODULATOR

[75] Inventor: Rishi Mohindra, Milpitas, Calif.

[73] Assignee: Philips Electronics North America Corporation, New York, N.Y.

[21] Appl. No.: 09/107,635

[22] Filed: Jun. 30, 1998

Related U.S. Application Data

[60] Provisional application No. 60/084,415, May 6, 1998.

[51] Int. Cl.[7] .............................. H03D 1/04; H03D 1/06; H03K 5/01; H03K 6/04; H04B 1/10
[52] U.S. Cl. ......................... 375/346; 375/278; 329/320
[58] Field of Search .................... 375/278, 284, 375/319, 346; 455/296, 309, 310, 312, 324; 329/318, 320, 349, 353, 304, 300

[56] References Cited

U.S. PATENT DOCUMENTS

| | | | |
|---|---|---|---|
| 4,944,025 | 7/1990 | Gehring et al. | 455/207 |
| 5,548,244 | 8/1996 | Clewer | 329/318 |
| 5,628,059 | 5/1997 | Kurisu | 455/126 |
| 5,701,600 | 12/1997 | Wetters et al. | 455/208 |
| 5,724,653 | 3/1998 | Baker et al. | 455/296 |
| 6,075,409 | 6/2000 | Khlat | 329/304 |

FOREIGN PATENT DOCUMENTS

| | | | |
|---|---|---|---|
| 0599409A2 | 1/1994 | European Pat. Off. | H04B 1/30 |
| 0599414A2 | 1/1994 | European Pat. Off. | H04B 1/30 |
| 0676880A2 | 10/1995 | European Pat. Off. | H04L 27/00 |
| WO9714158 | 4/1997 | WIPO | H01B 1/06 |
| WO9824209 | 6/1998 | WIPO | H04L 27/10 |

*Primary Examiner*—Don N. Vo
*Assistant Examiner*—Phuong Phu
*Attorney, Agent, or Firm*—Brian J. Wieghaus

[57] ABSTRACT

The present invention provides dc offset compensation circuit (800) for a zero IF FM quadrature demodulator in an AMPS cellular mobile telephone system. A frequency offset is introduced to remove modulation inherent dc components from supervisory audio tones and Manchester codes from a modulated signal. The local oscillator (608) is operated at a frequency that is slightly different, e.g. 5 kHz from a frequency which would mix down the intermediate frequency signal to zero. A dc offset is produced with a control loop to eliminate fixed dc components caused by leakage from a local oscillator (608). After a given time, the control loop may be frozen and the frequency offset of the local oscillator (608) can be removed.

20 Claims, 7 Drawing Sheets

DC OFFSET COMPENSATION FOR ZERO IF QUADRATURE DEMODULATOR

REFERENCE TO CLAIM BENEFIT OF AN EARLIER FILING DATE

This application claims the benefit of U.S. Provisional Application No. 60/084,415, filed May 6, 1998.

BACKGROUND OF THE INVENTION

1. Field of the Invention

This inventions relates to compensation circuits for demodulators, and particularly to circuits for intermediate frequency (IF) quadrature demodulators.

2. Discussion of the Background Art

Mobile phones are broadly classified as cellular or PCS (Personal Communication System). A cellular phone system operates at a carrier frequency of 900 MHz, while PCS operates at double this frequency, or 1.9 GHz. Analog modulation is Frequency Modulation (FM), while digital modulation includes CDMA (Code Division Multiple Access), TDMA (Time Division Multiple Access) and FDMA (Frequency Division Multiple Access).

Figure 1:
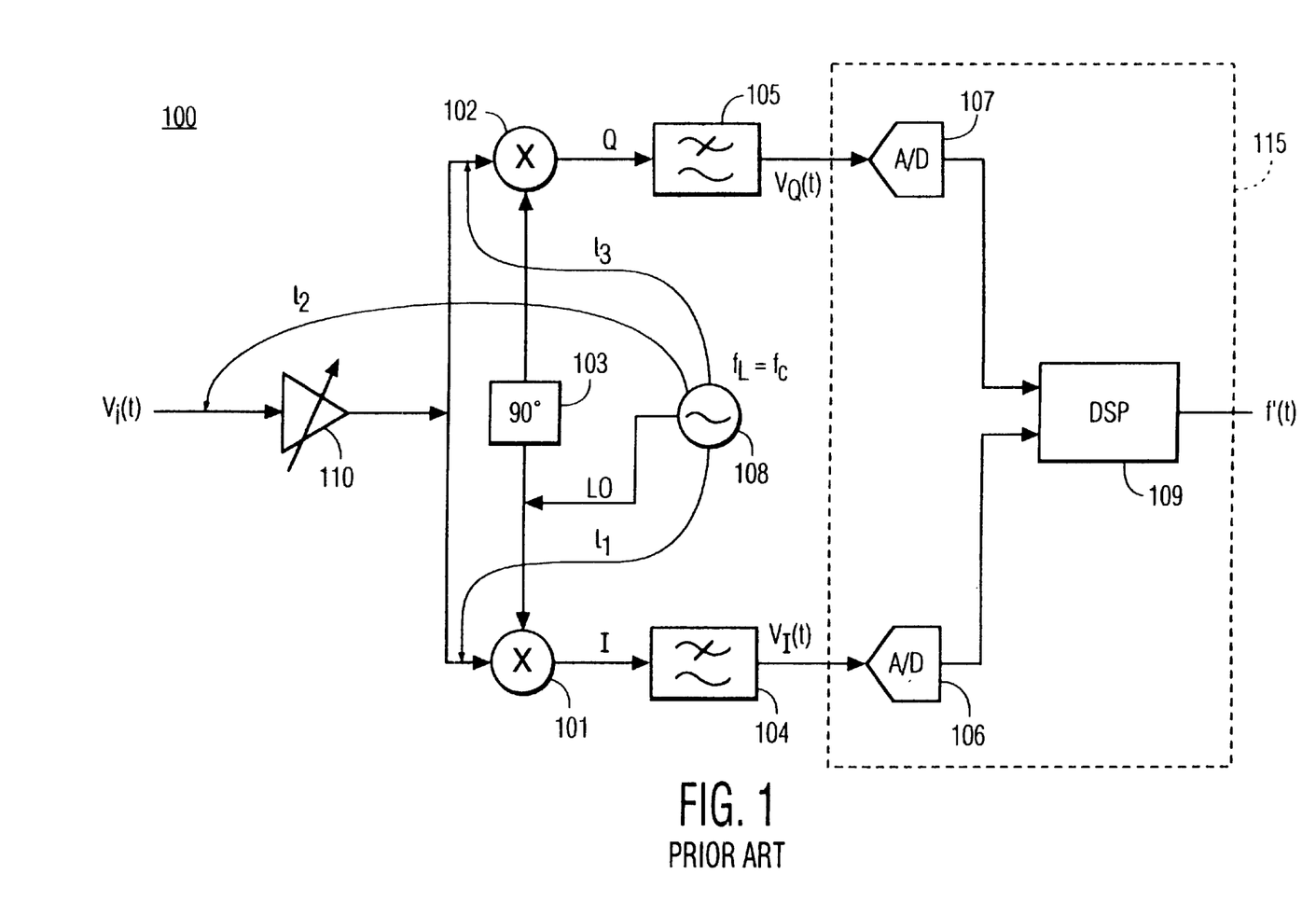
FIG. 1 shows a prior art quadrature demodulation circuit, illustrating leakage signals from the local oscillator into the gain and mixer stages of the circuit.

Quadrature modulation/demodulation refers to modulation/demodulation of orthogonal carrier signals. Modulators and demodulators are built on a monolithic semiconductor chip. A block diagram of a typical prior art quadrature demodulator is shown in FIG. 1. The demodulator includes two mixers 101 and 102, both of which comprise a signal input, an input from local oscillator 108 and a low frequency output. A modulated signal is fed to mixer 101, and LO signal from local oscillator 105 is also fed to mixer 101. The modulated signal is also fed to mixer 102, while local oscillator signal LO is fed to mixer 102 through a phase shifter 103 that produces a 90° phase shift with respect to the local oscillator signal LO fed to mixer 101.

The local oscillator 108 has a tendency to leak its signal LO into other parts of the demodulator system. It is often difficult to balance mixers 101 and 102 such that the level of an incoming carrier signal and the local oscillator 108 leak into a modulated high frequency signal are small enough with respect to the incoming signal $v_r(t)$. A local oscillator signal leak creates a significant distortion in the voice signal.

U.S. Pat. No. 5,012,208 to Makinen discloses a quadrature modulator having compensation for local oscillator leak. Makinen utilizes a circuit adding different compensation voltages to two modulator signals independently of one another on the basis of the correlation between amplitude variation of the output signal and the corresponding modulation signal. However, this patent is concerned with a modulator rather than a demodulator, and does not provide a frequency offset in the local oscillator.

Other prior art devices perform dc offset compensation by shutting off the RF input signal during a guard space between TDMA slots. Still, this technique is not effective when the signal is present due to the inherent dc offset from the modulated signal itself. Thus, there is a need to utilize dc offset compensation in the presence of the received signal.

More generally, other parts of the signal contribute to producing dc components. These other dc components interfere with removal of the unwanted dc component from local oscillator leakage. It is therefore necessary to compensate for these other dc components prior to removing the unwanted dc components from local oscillator leakage.

SUMMARY OF THE INVENTION

The present invention provides dc offset compensation in an AMPS cellular mobile telephone system using substantially zero IF FM demodulation. Leakage from the local oscillator generates a distortion producing dc offset signal that is removed using a compensating feedback loop. Other dc components, including those associated with supervisory audio tones and Manchester codes ("modulation inherent dc components"), that combine with and complicate removal of the leakage dc offset, are isolated by offsetting the frequency of the local oscillator slightly from frequency of the signal. The present invention avoids the use of distortion producing high pass filters in the removal of the leakage dc component.

A frequency offset is introduced to compensate for dc components caused by supervisory audio tones and Manchester codes. The frequency offset is introduced by running a local oscillator at a frequency slightly different, e.g. several kilohertz, from that required to mix down an intermediate frequency signal to zero. If the IF signal is 85 MHz, the local oscillator is offset to 85.005 MHz, so that the signal is mixed down to 5 kHz. In addition, a dc offset is produced using a digital signal processor control loop to compensate for dc leakage from the local oscillator. The control loop includes an integrator and an amplifier with a gain coefficient $\kappa$ that is proportional to the dc offset. The effect of the frequency offset is to ensure that the control loop for the dc offset operates correctly even in the presence of SAT and Manchester codes. After a given time, the control loop may be frozen and the frequency offset of the local oscillator removed.

DETAILED DESCRIPTION OF THE PREFERRED EMBODIMENTS

Referring now to FIG. 1, a prior art circuit is shown which provides zero IF (Intermediate Frequency) demodulation in an AMPS (Advanced Mobile Phone System) mobile telephone receiver. Zero IF quadrature refers to signal mixing of the IF carrier signal with a local oscillator to remove or zero out the carrier frequency component. In a zero IF quadrature system, the local oscillator is conventionally set at the same frequency ($f_L$) as the IF carrier signal ($f_c$, nominally at 85.0 MHz in an AMPS application). An incoming AMPS signal generally contains a number of components: (a) a voice signal, (b) a carrier frequency, (c) a supervisory audio tone, and (d) Manchester codes. The voice signal is the primary communication component containing audio frequency signals from the talker. The carrier frequency is conventionally used to modulate the voice signal, while the supervisory audio tone is used for remodulating the voice signal to another base station as a caller moves between cells. The Manchester code component communicates the AMPS protocol control signals between the phone and cell base station. Supervisory audio tones and Manchester codes produce an inherent dc modulation component when averaged over time.

Circuit 100 includes an automatic gain control variable amplifier 110, mixers 101 and 102, 90° phase shifter 103, low pass filters 104 and 105, analog-to-digital converters (A/D) 106 and 107, a digital signal processor (DSP) 109 and a local oscillator 108. The local oscillator 108 is preferably a VCTCXO (Voltage Controlled Temperature Compensated Crystal Oscillator), PLL (phase locked loop) or frequency synthesizer producing a signal LO. The analog-to-digital converters 106, 107 and the digital signal processor 109 combine to form the demodulator 115. Incoming modulated signal $v_i(t)$ is received by the amplifier 110 and split into two branches. The amplified $v_i(t)$ signal is combined with the local oscillator 108 signal at mixers 101 and 102. The local oscillator signal LO is phase-shifted by 90° at phase shifter 103. The I and Q output signals from mixers 101 and 102 are respectively low-pass filtered by filters 104 and 105 to produce time-varying voltages $V_I(t)$ and $V_Q(t)$, where the Q-subscript represents the phase-shifted quadrature component. Signals $V_I(t)$ and $V_Q(t)$ are FM demodulated by the DSP 109 (in the demodulator 115) to obtain a demodulated digital signal f'(t). One significant drawback of the demodulator circuit 100 is that the local oscillator 108 signal ($f_c$) has a tendency to leak into the amplifier 110 and mixers 101, 102, as shown graphically by paths $l_1$, $l_2$, and $l_3$. This signal leakage from the local oscillator 108 produces a distortion-producing dc offset in the $V_I(t)$ and $V_Q(t)$ signals. The present invention largely removes this dc offset caused by local oscillator 108 leakage.

Figure 2:
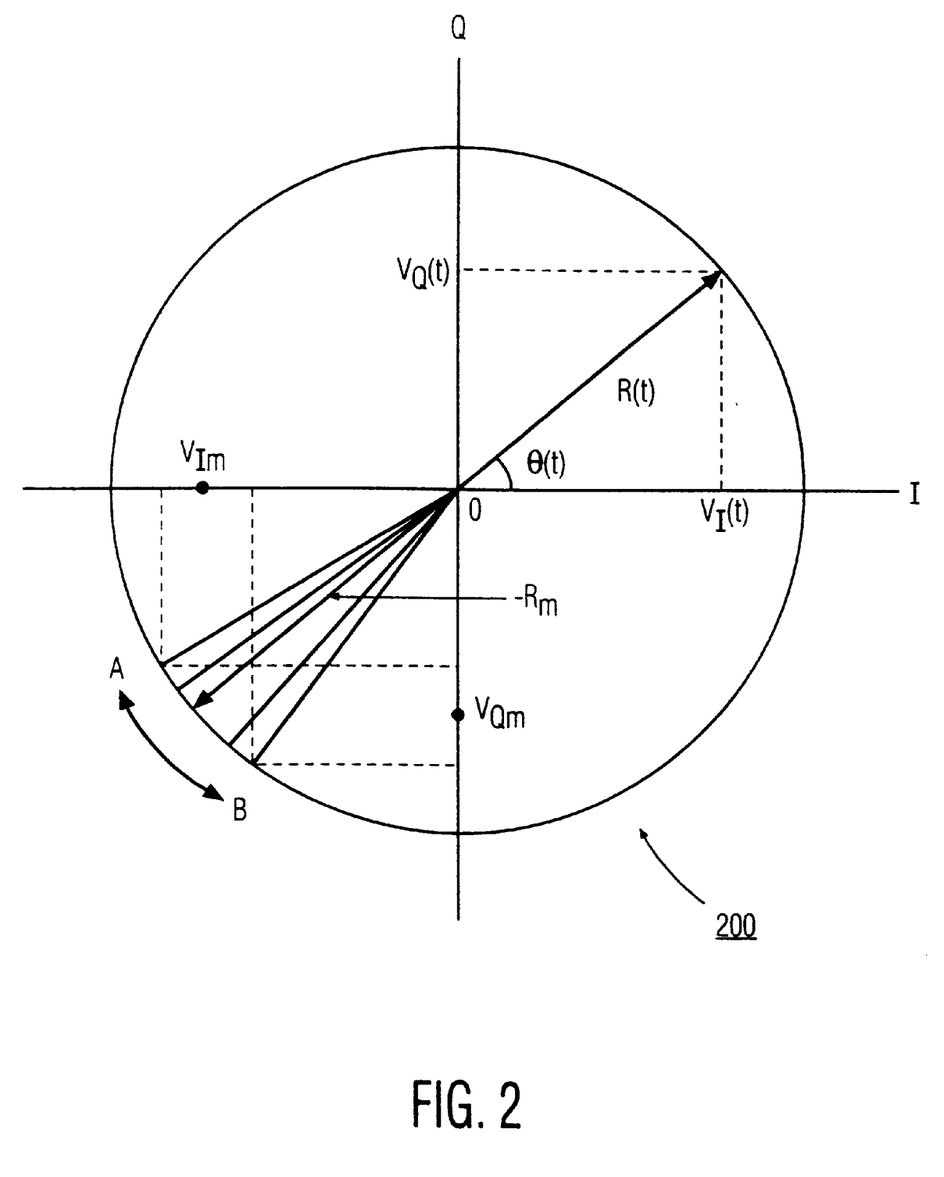
FIG. 2 is an I and Q-plane vector graph illustrating a modulation vector produced by the circuit of FIG. 1, requiring frequency offset.

The demodulator circuit 100 can be mathematically characterized by defining an input signal, $$v_i(t) = \cos\left\{2\pi f_0 t + \kappa \int_{-\infty}^{t} f(x)dx\right\}, \tag{1}$$

where the $f_0$ term is the carrier frequency, and the $\kappa$ term is the modulation index, the zero IF signals are (assuming $f_c = f_0$):

$$V_I(t) = \cos\left[\kappa \int_{-\infty}^{t} f(x)dx\right] = \cos[\theta(t)] \tag{2}$$

$$V_Q(t) = \sin[\theta(t)] \tag{3}$$

θ(t) represents a time-varying phase function related to an integral of the frequency modulation f(t) over time Referring now to FIG. 2, a deflection of modulation vector R(t) is shown in an I/Q circular coordinate plane. This deflection is due to the supervisory audio tone and the Manchester code, assuming no voice modulation is present. Scalar components $V_I(t)$ and $V_Q(t)$ are projections of modulation vector R(t) on the I and Q axes for angle θ(t). In the AMPS standard system, the modulation index is small for SAT and Manchester encoded data reception. Arc AB in FIG. 2 indicates a wobble in vector $R_m$ due to the small modulation index of the SAT and Manchester codes. This wobble is further discussed with reference to FIG. 5. The modulation index in such systems is proportional to κ in Equation (1). There is an inherent time-varying dc content due to the time-averaged values of the SAT and Manchester codes that adds to the fixed dc component of local oscillator leakage. The 'modulation inherent dc component,' i.e. the dc component averaged over time produced by the supervisory audio tone and Manchester codes, produces an equivalent dc offset vector $R_m$ in the complex plane:

$$\overline{v_{Im}} + j\overline{v_{Qm}} = -R_m \tag{4}$$

The modulation-inherent dc component of the supervisory audio tones and Manchester codes combine with the dc leakage from the local oscillator 108, making cancellation of the local oscillator leakage ($l_1$, $l_2$, and $l_3$) difficult. The modulation-inherent dc component acts to confuse the demodutor 115 so that further measures must be taken in order for the dc compensation scheme due to local oscillator leakage to be effective. In order to effectively eliminate the dc component resulting from local oscillator 108 leakage, it is necessary to isolate the local oscillator dc from the time-varying dc components contributed by the Manchester and SAT signals. This isolation is accomplished below by adding a small frequency offset to the local oscillator 108, as discussed with reference to FIG. 6.

Figure 3:
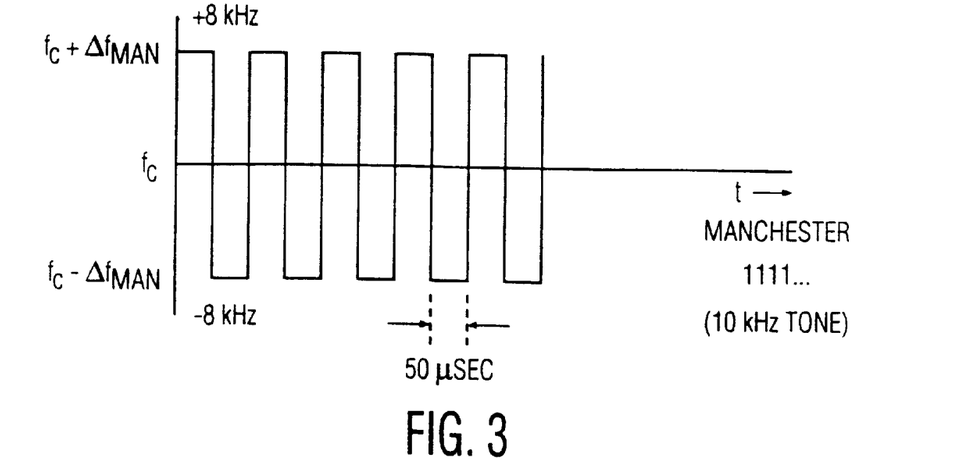
FIG. 3 is time domain graph illustrating a waveform of a frequency modulated Manchester encoded signal, for a 1111 ... data sequence of 10 Kb/s.
Figure 4:
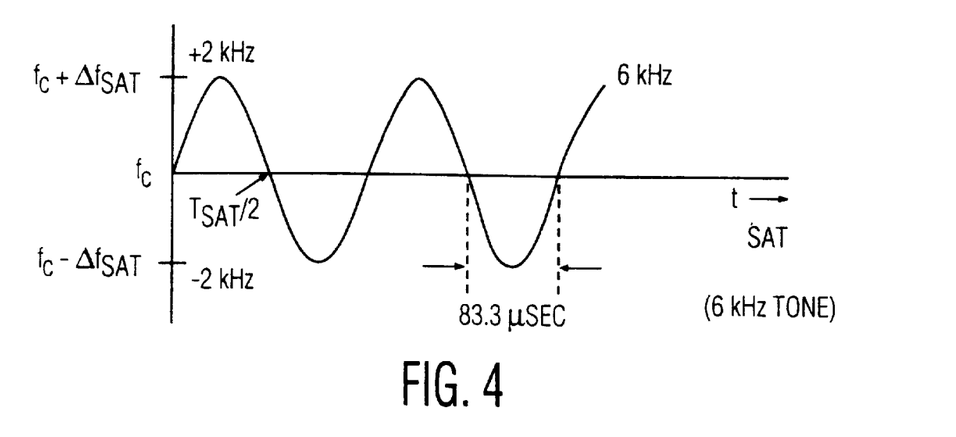
FIG. 4 is a time domain graph illustrating a 6 KHz supervisory audio tone frequency modulation waveform.
Figure 5:
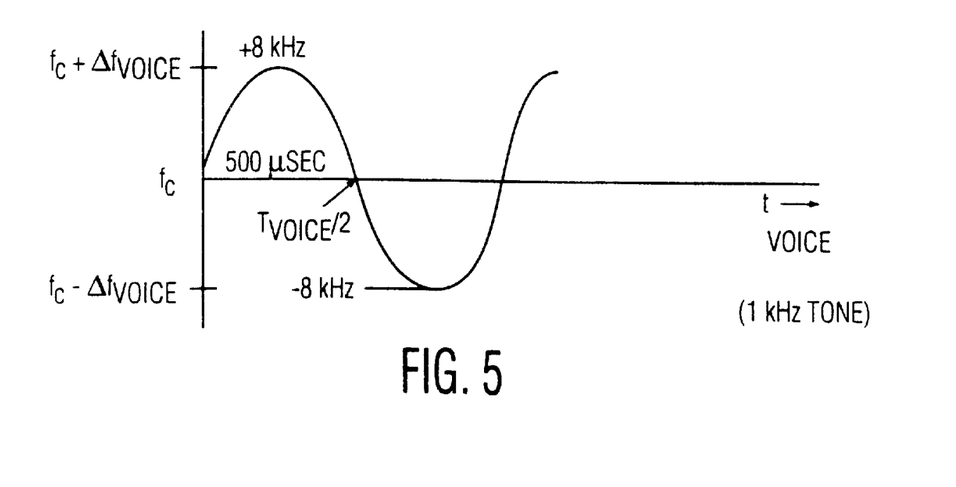
FIG. 5 is a time domain graph illustrating a 1 KHz voice modulation signal.

Referring now to FIGS. 3–5, time-domain graphs illustrate the relationship between the supervisory audio tone (SAT), Manchester code and voice modulation signals. The AMPS SAT and Manchester codes are frequency modulated signals. A Manchester code is a digital format where binary values {0, 1} are represented as anti-phases [1, −1] and [−1, 1], respectively. The Manchester coding signal in the AMPS system communicates the AMPS protocol control signals between the phone and cell base station. Manchester coding for AMPS has a characteristic frequency of 10 kHz for a data bit rate of 10 kilobits per second, as shown in FIG. 3. This corresponds to a period, $T_{MAN}$ of 100 microseconds. The frequency deviation for the Manchester signal is $\Delta f_{MAN}=8$ KHz.

The supervisory audio tone of FIG. 4 is a sinusoidal waveform having a characteristic frequency of about 6 kHz. The function of the supervisory audio tone in the AMPS system is to enable remodulation of the voice signal between base stations as the caller moves from cell to cell. The frequency deviation for the SAT signal is $\Delta f_{SAT}=2$ kHz. Therefore, as shown in FIG. 4, the supervisory audio tone shifts a carrier frequency $f_c$ from a maximum of $f_c+\Delta f_{SAT}$ to a minimum of $f_c-\Delta f_{SAT}$. The supervisory audio tone has a period $T_{SAT}$ of about 167 microseconds. The phase change, Δθ, due to the dc contributions of the Manchester code and supervisory audio tone can be obtained from the equation:

$$\Delta\theta(t) = \kappa \int_{0}^{T/2} f(t)dt. \tag{5}$$

The effect of this time-varying change of phase, Δθ(t), on signal R(t) in the I/Q plane is shown in FIG. 2.

FIG. 5 shows a waveform for a corresponding voice modulation signal R(t). The voice modulation signal is frequency modulated over a carrier frequency $f_c$ from a maximum of $f_c+\Delta f_{voice}$ to a minimum of $f_c-\Delta f_{voice}$, where $\Delta f_{voice}=8$ kHz maximum. Here, $\Delta\theta_{voice}(t) >> \Delta\theta_{SAT}$, $\Delta\theta_{voice}(t) >> \Delta\theta_{Man}$, and $\Delta\theta_{voice}(t) >> 2\pi$. Thus, R(t) rotates many times around the origin of the I/Q circle in FIG. 2, while phase change $\Delta\theta_{SAT}(t)+\Delta\theta_{Man}(t)$ produces vector $R_m$, which wobbles back and forth along arc $\overline{AB}$ due to the small modulation index of the SAT and Manchester codes. Averaging R(t) and $-R_m$ over time, modulation vector R(t) has an average value of zero, but vector $-R_m$, has non-zero scalar average value components:

$$\overline{V_I(t)}=\overline{v_{Im}}, \overline{V_Q(t)}=\overline{v_{Qm}} \quad (6)$$

Figure 6:
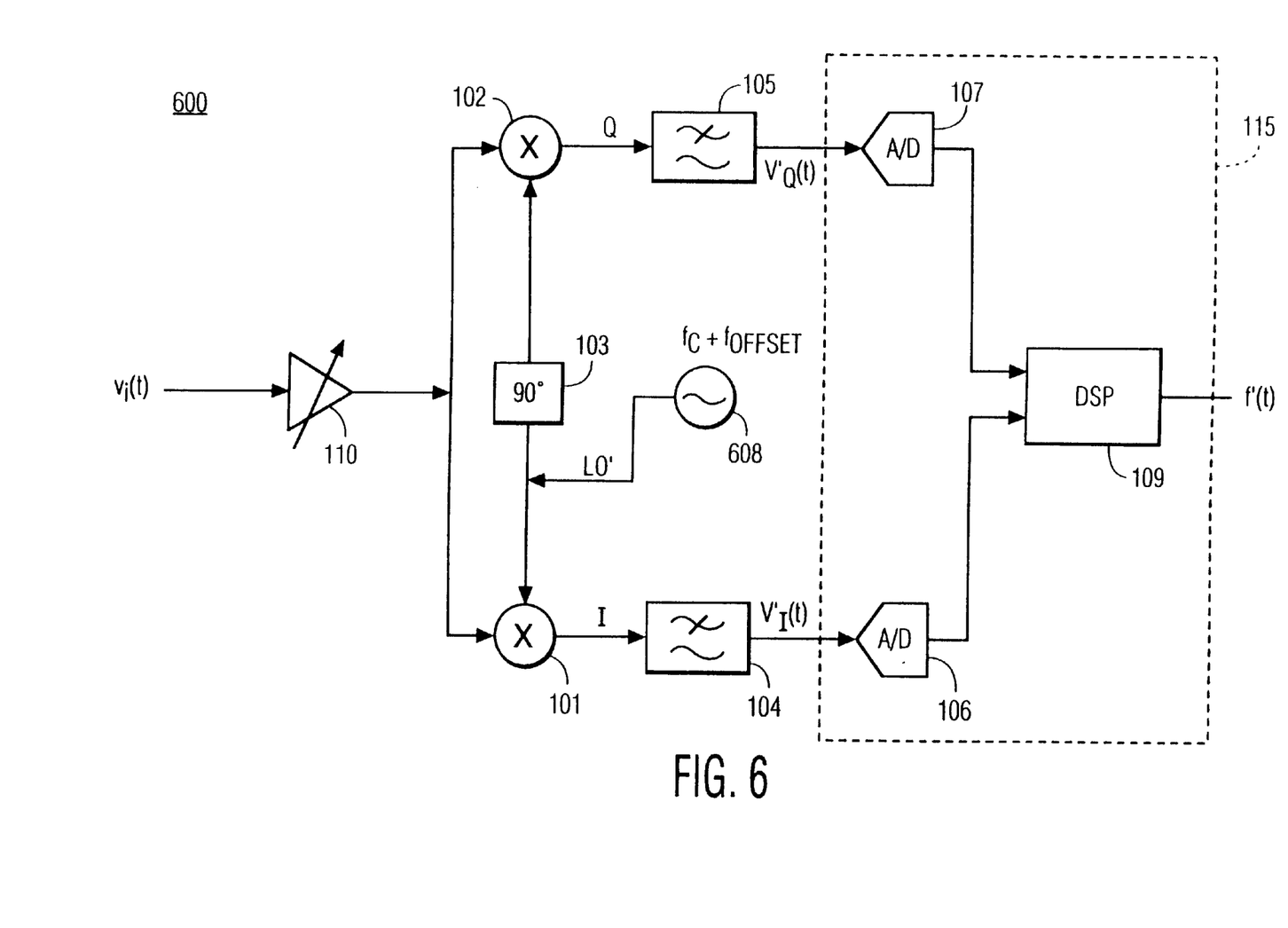
FIG. 6 shows a quadrature demodulation circuit of the present invention, in which the local oscillator frequency has been shifted by an offset frequency.

Referring now to FIG. 6, the demodulation circuit of FIG. 1 is shown with a modified local oscillator 608. The modified demodulation circuit 600 utilizes the local oscillator 608 having an output signal LO with an oscillation frequency of $f_c+f_{OFFSET}$. The present invention enables isolation of the dc components of the SAT and Manchester code on the local oscillator cancellation scheme by producing a frequency offset in the local oscillator 608. This frequency offset operates to make the modulation resulting from the dc offset of the SAT and Manchester components very small in comparison to the local oscillator 608 leakage dc offset. Assuming the preferred intermediate frequency $f_c$ is 85 MHz, the local oscillator 608 is operated at a small frequency offset, e.g. 5 kHz, to obtain a local oscillator frequency of 85.005 MHz. Thus, an intermediate or radio frequency is not mixed down to zero, but to some small frequency offset, $\Delta f$, of 5 kHz. This eliminates vector $R_m$ of FIG. 2 caused by the SAT and Manchester dc components, and permits cancellation of the dc component due to local oscillator 108 leakage with the feedback loop discussed below with reference to FIG. 8.

The present invention, therefore, contemplates mixing down to a very low intermediate frequency, e.g. 5 kHz, instead of zero Hz IF, so that the long-term average of the SAT/Manchester components of the signal disappears before the dc offset from the local oscillator leakage is canceled. If $\Delta f$ is the frequency offset, $$V_I(t) = \cos\left[2\pi\Delta f t + \kappa \int_{-\infty}^{t} f(x)dx\right] + v_{Ilo} \quad (7)$$

and $$\overline{V_I(t)} \approx \overline{\cos(2\pi\Delta f t)} + v_{Ilo} \quad (8)$$
$$\approx 0 + v_{Ilo}$$

where $v_{Ilo}$= static dc offset in the I-channel, due to local oscillator leakage.

This assumes that $$2\pi\Delta f t \gg \kappa \int_0^t f(x)dx$$

for an integration time t=T, over which the dc offset is cancelled.

Figure 7:
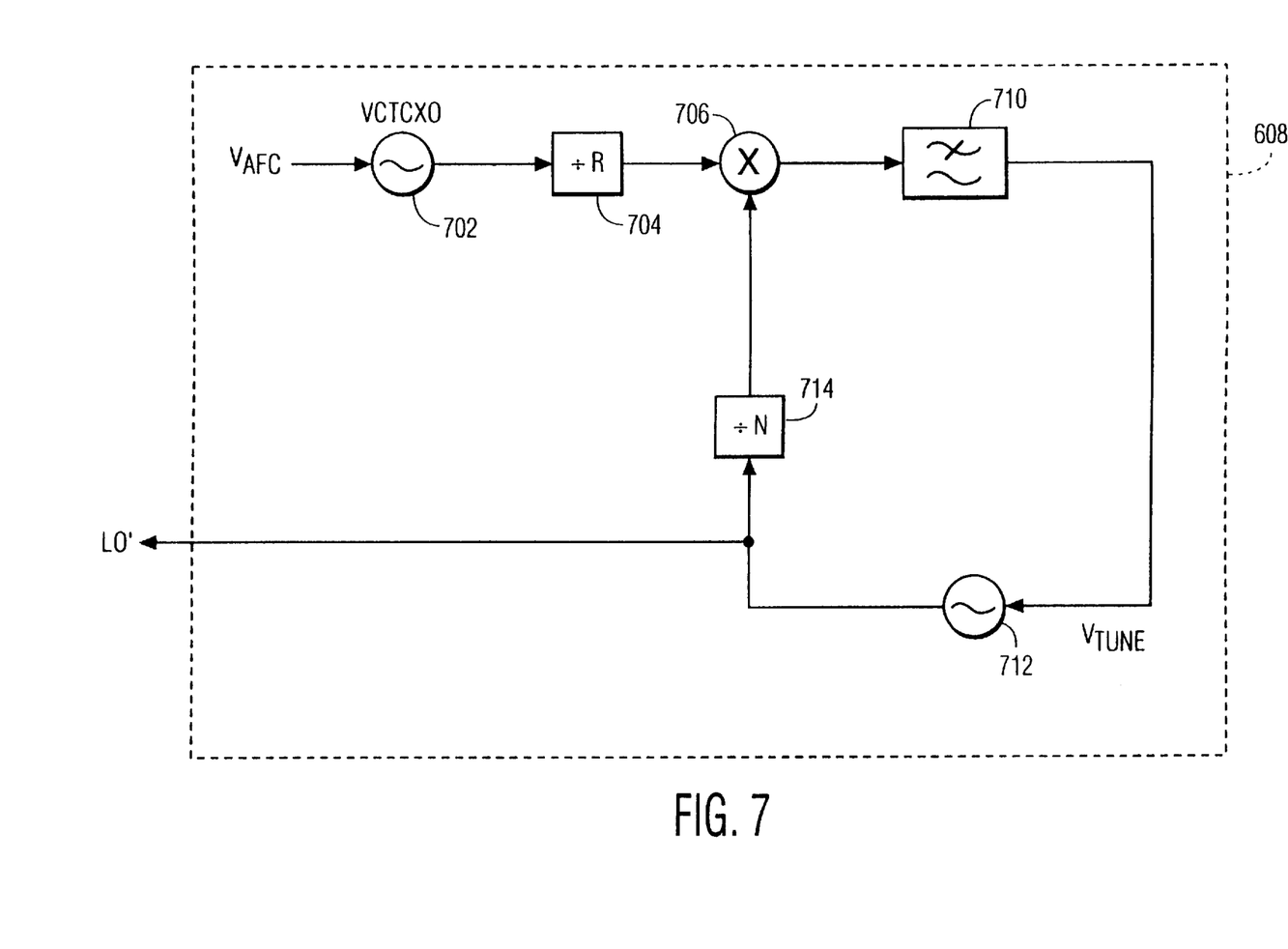
FIG. 7 shows details of the local oscillator of FIG. 6.

Referring now to FIG. 7, a preferred embodiment is shown of the local oscillator 608 of FIG. 6. Local oscillator 608 utilizes a conventional voltage controlled, temperature compensated, crystal oscillator (VCTCXO) 702 to generate a stable base frequency of 19.68 MHz. The VCTCXO 702 receives a frequency control signal $V_{AFC}$ to maintain precise tuning. The VCTCXO 702 output signal is reduced in frequency by a factor of R in divider 704. The divided frequency signal is then phase detected in mixer 706 and filtered in filter 710. The filter 710 is a low pass filter to remove high frequency noise and harmonics. This filtered signal $V_{TUNE}$ from filter 710 is used to control a voltage controlled oscillator 712 for producing the local oscillator 608 output signal LO. The output signal LO is then reduced in frequency by a factor of N in divider 714 and phase detected with the divided (by R) VCTXCO 702 signal in mixer 706. In the preferred embodiment, both dividers 704 and 714 are programmable, enabling precise control over the frequency offset added to the oscillator frequency from the VCTCXO 702.

Figure 8:
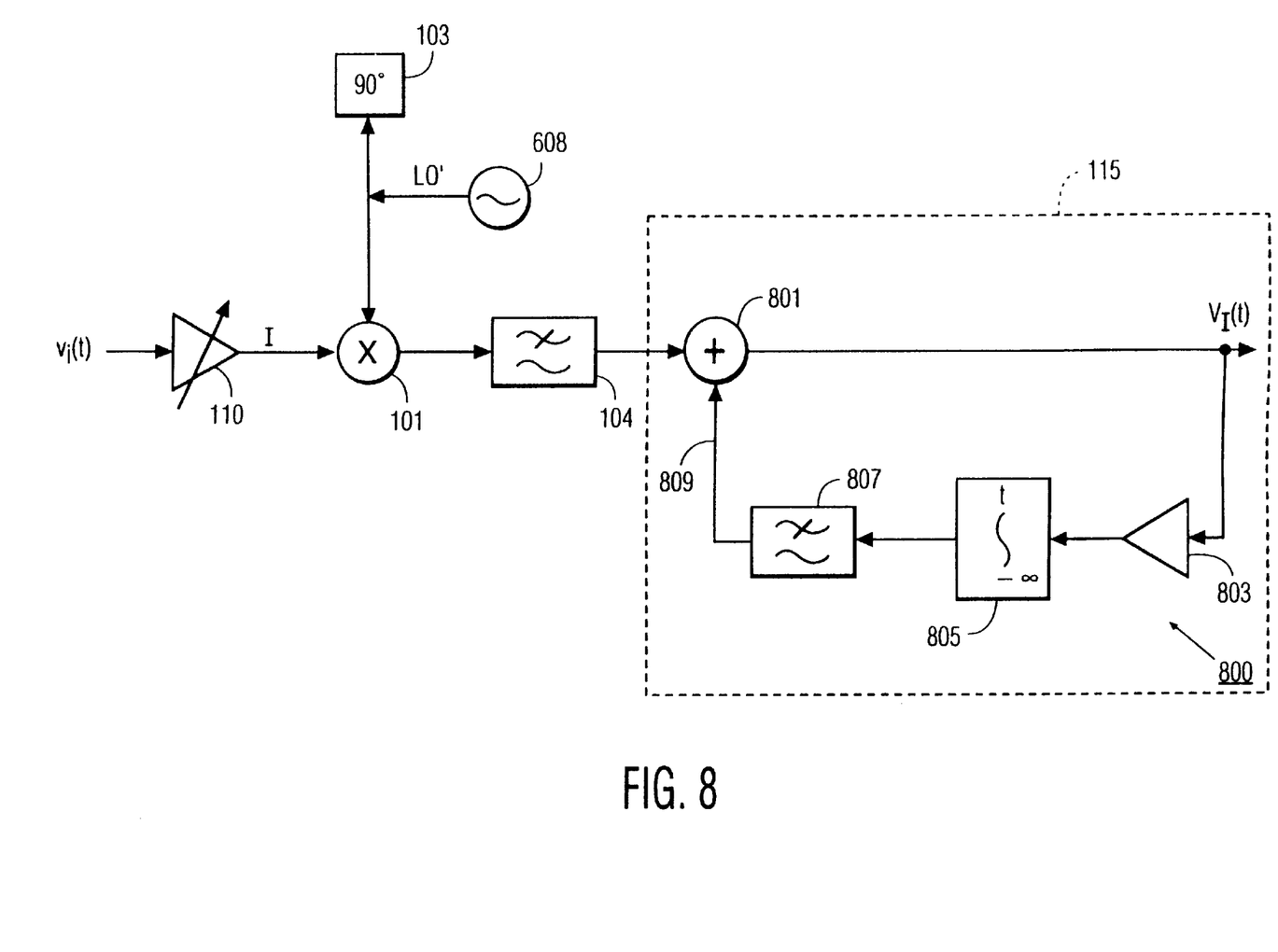
FIG. 8 shows details of the quadrature demodulator of FIG. 6, in which a digital signal processor feedback loop compensates for dc offset effects resulting from the local oscillator leakage illustrated in FIG. 1.

Referring now to FIG. 8, a functional schematic diagram is shown of a dc offset cancellation scheme to reduce the dc offset voltage resulting from the local oscillator 608 leakage. In the preferred embodiment, the dc cancellation is actually implemented in demodulator 115, using digital signal processing techniques which execute the analog components (801, 803, 805 and 807 ) of the FIG. 8 schematic. Analog functional blocks are shown in FIG. 8 to facilitate explanation of the invention. Analog and digital implementations of this dc canceling method are equivalent for purposes of this invention. It should also be noted that FIG. 8 illustrates dc cancellation for the I branch only, and that the I and Q branch cancellation methods are identical.

The I branch shown in FIG. 8 includes amplifier 110, mixer 101, filter 104, and compensating circuit 800. The compensating circuit 800 functionally consists of a control loop comprising mixer 801, κ amplifier 803, integrator 805 and low pass filter 807. The demodulation circuit 100 incoming voice signal, $v_i(t)$, is received by the amplifier 110 and mixed with the local oscillator 108 signal (LO) in mixer 101. It should be noted here that the Q branch equivalency of the I branch circuit of FIG. 8, receives a phase-shifted local oscillator 608 signal that has been passed through the phase shifter 103. The signal from mixer 101 is then filtered in filter 104 before being received by the compensating circuit 800. Upon entering the compensating circuit 800, the filtered signal is combined with feedback signal 809 in mixer 801. The mixed signal $V_I(t)$ is then amplified in amplifier 803 and integrated over time (t) in integrator 805. This time-integrated signal from integrator 805 is filtered in low pass filter 807. In the preferred embodiment, low pass filter 807 is a first-order RC filter. Feedback signal 809 from the low pass filter 807 is then combined with the output of filter 104 in mixer 801.

As discussed above with reference to FIG. 6, two different dc components are operating in the demodulation circuit 100. A modulation-inherent dc component is present as a result of the Manchester and SAT signals. Additionally, local oscillator 108 leakage produces a distortion-producing dc component. Unless the two dc signal sources can be separated, cancellation of the leakage dc is difficult. By providing a small offset to the local oscillator 608 frequency, the modulation-inherent dc component can be greatly reduced compared to the leakage dc, thus isolating the leakage dc. This isolated leakage dc can then be easily removed by the compensation circuit 800. Since the compensation circuit 800 is implemented using a digital signal processor 109, once the feedback signal 809 becomes stable for eliminating the leakage dc, the value of the feedback signal can be fixed. Once the demodulator 115 fixes the feedback signal 809, the slight frequency offset in the local oscillator 608 can be removed and the local oscillator signal LO frequency can be restored to match the AMPS carrier frequency ($f_c$) of the incoming signal $v_i(t)$.

Figure 9:
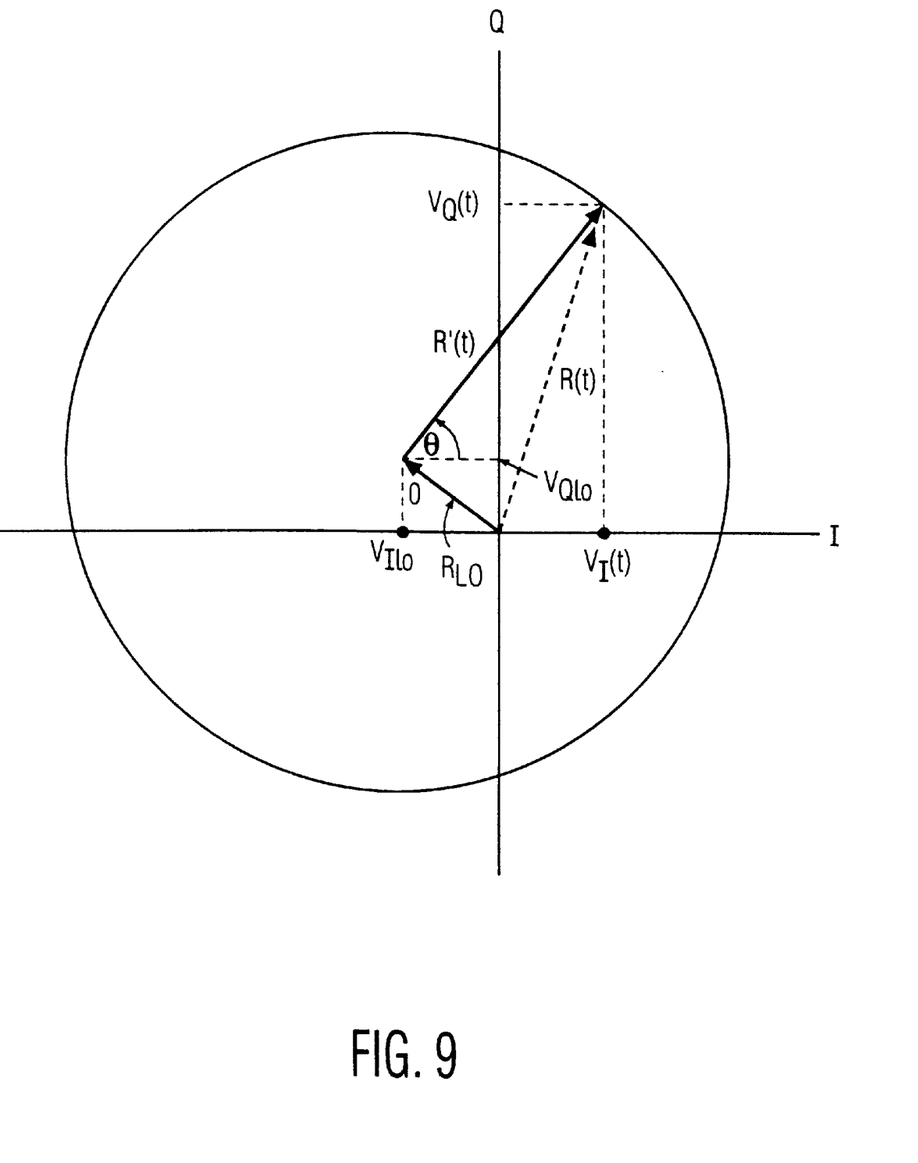
FIG. 9 is an I and Q-plane vector graph illustrating the effects of dc compensation produced by the circuit of FIG. 6.

Referring now to FIG. 9, an I/Q circular coordinate plane illustrates the effect of dc leakage from local oscillator 108 in signal distortion, and the effect of compensating the demodulator using the circuit of FIG. 8. Vector R'(t) represents a voice modulation signal without distortion due to dc leakage from local oscillator 108, while vector $R_{LO}$ represents dc leakage from local oscillator 108. Local oscillator leakage vector $R_{LO}$ has components $V_{Ilo}$ and $V_{Qlo}$ projected onto I and Q axes, respectively. Modulation vector R(t) has components $V_I(t)$ and $V_Q(t)$ projected onto I and Q axes. Vector $R_{LO}$ causes voice modulation vector R'(t) to be displaced from the origin as distorted vector R(t).

While dc offset vector $R_{LO}$ has constant phase, that is, constant direction in the I/Q plane, modulation vector R(t) rotates around the origin many times since the frequency offset has significant phase modulation. The phase modulation of the frequency offset signal is the integral under the curve of the frequency modulated signal in FIG. 5. The integral of frequency curve f(t) over time represents a change of phase, and a rotation of voice modulation vector R(t) around the origin of the I/Q plane. With the frequency offset, vector R(t) rotates many times around the origin during each cycle. The half cycle period for voice, $T_{voice}/2$ is on the order of 0.5 milliseconds, or 500 $\mu$sec, while $T_{SAT}/2$ for a supervisory audio tone is about 83 $\mu$sec, which is much smaller.

However, local oscillator leakage causes an offset of the origin for modulation vector R(t). Therefore, the displacement of modulation vector R(t) by dc offset vector $R_{LO}$ changes modulation voltages $V_I(t)$ and $V_Q(t)$ due to the displacement of R(t) from the origin in FIG. 2. Voltages $V_I(t)$ and $V_Q(t)$ are no longer related as simple functions of R(t) cos θ and R(t) sin θ, respectively. Modulation vector R(t) adds to the dc offset vector $R_{LO}$ to produce modulation vector R'(t), which is displaced from origin O, as in FIG. 9. This produces distortion in voice modulation vector R'(t), which is eliminated by the compensating circuit 800 of FIG. 8.

The preferred embodiment described in the preceding description is provided to enable one of ordinary skill in the art to make and use the invention. Various modifications to these embodiments will be readily apparent to those having ordinary skill in the art. For instance, although the preferred embodiment shows the phase shifter 103 located between the local oscillator 608 and mixer 102, those with ordinary skill in the art will readily recognize that the phase shifter could equivalently be inserted along the $v_I(t)$ signal path prior to the mixer 102. In any event, the I signal path and Q signal path are phase shifted by 90 degrees. Therefore, the present invention is not intended to be limited to the specific embodiments described herein, but is to be accorded the widest scope consistent with the principles and novel features disclosed herein.

What is claimed is:

1. A method of compensating for dc voltages in a quadrature demodulator, comprising:

receiving a modulated signal with a center frequency $f_c$;

splitting the modulated signal into a first path and a second path;

mixing the modulated signal of the first path with a local oscillator signal to generate an I path signal and mixing the modulated signal of the second path with the local oscillator signal to produce a Q path signal, such that the I path signal is phase shifted from the Q path signal by approximately 90 degrees, and wherein the local oscillator signal is offset in frequency from the center frequency $f_c$;

removing dc components from the mixed modulated signal; and demodulating the mixed modulated signal.

2. The method of compensating for dc voltages of claim 1, further comprising the step of variably amplifying the modulated signal.

3. The method of compensating for dc voltages of claim 1, wherein the local oscillator is offset from the modulated signal center frequency by approximately 5 KHz.

4. The method of compensating for dc voltages of claim 1, wherein the modulated signal center frequency is approximately 85 MHz.

5. The method of compensating for dc voltages of claim 1, wherein the dc components are removed using digital signal processing techniques.

6. The method of compensating for dc voltages of claim 1, wherein the dc components are removed by producing a dc-canceling signal.

7. The method of compensating for dc voltages of claim 6, further comprising the steps of:

freezing the value of the dc-canceling signal; and setting the frequency of the local oscillator signal to a value approximately equal to the center frequency of the modulated signal.

8. A system for compensating dc voltages in a quadrature demodulator, comprising:

means for receiving a modulated signal with a center frequency $f_c$;

means for splitting the modulated signal into a first path and a second path;

means for mixing the modulated signal of the first path with a local oscillator signal to generate an I path signal and means for mixing the modulated signal of the second path with the local oscillator signal to produce a Q path signal, such that the I path signal is phase shifted from the Q path signal by approximately 90 degrees, and wherein the local oscillator signal is offset in frequency from the center frequency $f_c$;

means for removing the dc components from the mixed modulated signal using a feedback network; and means for demodulating the mixed modulated signal.

9. The system for compensating dc voltages of claim 8, wherein the local oscillator is offset from the modulated signal center frequency by approximately 5 KHz.

10. The system for compensating for dc voltages of claim 8, wherein the modulated signal center frequency is approximately 85 MHz.

11. The system for compensating for dc voltages of claim 8, wherein the feedback network is implemented using digital signal processing techniques.

12. The system for compensating for dc voltages of claim 8, wherein the feedback network removes the dc components by producing a dc-canceling signal.

13. The system of compensating for dc voltages of claim 12, further comprising:

means for freezing the value of the dc-canceling signal in the feedback network; and means for setting the frequency of the local oscillator signal to a value approximately equal to the frequency of the modulated signal center frequency.

14. A system for removing a dc offset from a modulated signal in a communication receiver, comprising:

an input communication signal, having a modulated signal center frequency of $f_c$, the input communication signal further comprising a dc offset component;

an I signal path and a Q signal path, each path coupled to the input communication signal, wherein the I signal path is phase shifted from the Q signal path by approximately 90 degrees;

a local oscillator coupled to the I signal path and to the Q signal path for mixing with the input communication signal, the local oscillator having an oscillation frequency that is offset from the modulated signal center frequency;

a cancellation circuit coupled to the I signal path and to the Q signal path for removing the dc offset component from the mixed input communication signal;

a demodulator coupled to the cancellation circuit for demodulating the mixed input communication signal.

15. The system of claim 14, further comprising a gain stage coupled between the input communication signal and the I and Q signal paths for variably adjusting the amplitude of the input communication signal.

16. The system of claim 14, wherein the cancellation circuit is implemented using digital signal processing techniques.

17. The system of claim 14, wherein the local oscillator is programmable.

18. The system of claim 14, wherein the input communication signal comprises a voice signal component.

19. The system of claim 14, wherein the cancellation circuit is a feedback network that removes the dc offset component by introducing a dc-canceling signal, and the dc-canceling signal value can be stored by the feedback network and asserted independent of the mixed input communication signal.

20. The system of claim 19, wherein the local oscillator can be programmably set approximately equal to the modulated signal center frequency while the stored dc canceling signal is being asserted by the feedback network.

* * * * *